(12) United States Patent
Smith et al.

(10) Patent No.: US 7,843,125 B2
(45) Date of Patent: Nov. 30, 2010

(54) ORGANIC LIGHT EMITTING DIODE

(75) Inventors: Euan Smith, Cambridge (GB); Faisal Qureshi, Manchester (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 10/587,195

(22) PCT Filed: Jan. 25, 2005

(86) PCT No.: PCT/GB2005/000258
§ 371 (c)(1), (2), (4) Date: Apr. 30, 2007

(87) PCT Pub. No.: WO2005/071771
PCT Pub. Date: Aug. 4, 2005

(65) Prior Publication Data
US 2007/0285003 A1 Dec. 13, 2007

(30) Foreign Application Priority Data
Jan. 26, 2004 (GB) .................................. 0401613.5

(51) Int. Cl.
*H01L 51/50* (2006.01)
(52) U.S. Cl. ............................ 313/504; 313/506; 445/25
(58) Field of Classification Search .................. 313/504, 313/506; 445/24, 25
See application file for complete search history.

(56) References Cited

U.S. PATENT DOCUMENTS

| | | | |
|---|---|---|---|
| 4,539,507 A | 9/1985 | VanSlyke et al. | 313/504 |
| 5,049,780 A | 9/1991 | Dobrowolski et al. | |
| 5,429,884 A | 7/1995 | Namiki et al. | 428/690 |
| 5,457,565 A | 10/1995 | Namiki et al. | 359/273 |
| 5,714,838 A | 2/1998 | Haight et al. | 313/506 |
| 5,739,545 A | 4/1998 | Guha et al. | 257/40 |
| 5,937,545 A | 8/1999 | Dyer et al. | 36/35 R |
| 6,211,613 B1 | 4/2001 | May | 313/504 |
| 6,284,393 B1 | 9/2001 | Hosokawa et al. | 428/690 |
| 6,316,786 B1 | 11/2001 | Mueller et al. | 257/40 |
| 6,411,019 B1 | 6/2002 | Hofstra et al. | 313/112 |
| 2003/0085652 A1 | 5/2003 | Weaver | 313/506 |
| 2003/0127971 A1* | 7/2003 | Hofstra et al. | 313/504 |
| 2003/0234609 A1* | 12/2003 | Aziz et al. | 313/504 |
| 2005/0007014 A1 | 1/2005 | Kurata | 313/504 |

FOREIGN PATENT DOCUMENTS

EP 278 757 B1 8/1988

(Continued)

OTHER PUBLICATIONS

"Scattering-Matrix Treatment of Patterned Multilayer Photonic Structures", Whittaker et al., Physical Review B, vol. 60, No. 4, 1999, pp. 2610-2618.

(Continued)

*Primary Examiner*—Nimeshkumar D Patel
*Assistant Examiner*—Mary Ellen Bowman
(74) *Attorney, Agent, or Firm*—Marshall, Gerstein & Borun LLP

(57) ABSTRACT

This disclosure generally relates to improved structures for organic light emitting diodes (OLEDs), and more particularly to so-called top emitting OLEDs.

13 Claims, 4 Drawing Sheets

FOREIGN PATENT DOCUMENTS

| | | |
|---|---|---|
| EP | 372 763 B1 | 6/1990 |
| EP | 880 303 B1 | 11/1998 |
| EP | 1 076 368 A2 | 2/2001 |
| JP | 8-185984 | 7/1996 |
| JP | 10-294182 | 11/1998 |
| WO | WO 90/13148 | 11/1990 |
| WO | WO 95/06400 | 3/1995 |
| WO | WO 98/07202 | 2/1998 |
| WO | WO 99/31741 | 6/1999 |
| WO | WO 99/48160 | 9/1999 |
| WO | WO 00/35028 | 6/2000 |
| WO | WO 01/08240 A1 | 2/2001 |
| WO | WO 02/066552 A1 | 8/2002 |
| WO | WO 2004/004421 A2 | 1/2004 |
| WO | WO 2004004421 A2 * | 1/2004 |
| WO | WO 2004/044998 A2 | 5/2004 |

OTHER PUBLICATIONS

"Radiation Damage and Transmission Enhancement in Surface-Emitting Organic Light-Emitting Diodes", Hung et al., Thin Solid Films 410, 2002, pp. 101-106.

"High-Contrast Organic Light-Emitting Diodes on Flexible Substrates", Krasnov, Applied Physics Letters, vol. 80, No. 20, 2002, pp. 3853-3855.

"Transparent-Cathode for Top-Emission Organic Light-Emitting Diodes", Han et al., Applied Physics Letters, vol. 82, No. 16, 2003, pp. 2715-2717.

"Tuning the Emission Characteristics of Top-Emitting Organic Light-Emitting Devices by Means of a Dielectric Capping layer: An Experimental and Theoretical Study", Riel et al., Journal of Applied Physics, vol. 94, No. 8, 2003, pp. 5290-5296.

International Search Report in PCT/GB2005/000258 dated Jun. 30, 2005.

Search Report in GB 0401613.5 dated Jul. 14, 2004.

International Preliminary Report on Patentability for International PCT Application No. PCT/GB2005/000258, dated Jul. 27, 2006.

* cited by examiner

ORGANIC LIGHT EMITTING DIODE

BACKGROUND OF THE INVENTION

1. Field of the Invention

This invention generally relates to improved structures for organic light emitting diodes (OLEDs), and more particularly to so-called top-emitting OLEDs.

2. Related Technology

Organic light emitting diodes (OLEDs) fall into two basic categories, bottom emitting devices and top emitting devices. Bottom emitting devices are fabricated on a substrate, typically glass, over which is deposited an ITO (indium tin oxide) anode, followed by OLED material and then a substantially opaque cathode. When electrically stimulated such an OLED emits light from the OLED material through the semi-transparent ITO layer and the glass substrate.

Heretofore substantially all practical devices have been of this type although such a structure exhibits some significant disadvantages. Firstly absorption and reflection losses within the substrate reduce the efficiency of such a device. However perhaps more importantly where, as in active matrix devices, thin film driver circuitry is associated with an OLED this reduces the light-emitting area available for a pixel of a display, since this circuitry is normally light-sensitive. It is therefore desirable to be able to fabricate so-called top emitters in which the anode is opaque and the cathode substantially transparent, so that light is emitted through the cathode rather than through the anode. In the case of an active matrix display this allows substantially all the area of a pixel to be occupied by light emitting material, and also allows a greater area to be allocated to thin film driver transistors, consequently increasing device efficiency and OLED lifetime (since a smaller current density may be employed for the same total light output). However although device structures have been proposed for top emitting OLEDs these have practical difficulties, as discussed further below.

FIG. 1 shows a vertical cross section through an example of a top-emitting OLED device, in this example comprising part of an active matrix display and thus including associated drive circuitry. The structure of the device is somewhat simplified for the purposes of illustration.

The OLED 100 comprises a glass substrate 102 supporting a plurality of polysilicon and/or metallisation and insulating layers 104 in which the drive circuitry is formed. The uppermost layer of this set of layers comprises an insulating and passivating oxide layer ($SiO_2$) over which an anode layer 106 is deposited. This anode layer may be formed from ITO (indium tin oxide), for example where the drive circuitry in a layer 104 only occupies part of an area of a pixel and it is desired to provide a substantially transparent device emitting from both sides. However one advantage of a top-emitting device is that the anode need not be transparent and may comprise a conventional metal layer such as a platinum layer.

One or more layers of OLED material 108 are deposited over an anode 106, for example by spin coating and subsequent removal of organic material from unwanted regions (by, for example, laser ablation), or by selective deposition, for example using an inkjet-based deposition process (see, for example, EP0880303). Organic LEDs may be fabricated using a range of materials including polymers, dendrimers, and so-called small molecules, to emit over a range of wavelengths at varying drive voltages and efficiencies. Examples of polymer-based OLED materials are described in WO90/13148, WO95/06400 and WO99/48160; examples of dendrimer-based materials are described in WO02/066552; and examples of small molecule OLED materials are described in U.S. Pat. No. 4,539,507. In the case of a polymer-based OLED layers 108 comprise a hole transport layer 108a and a light emitting polymer (LEP) electroluminescent layer 108b. The electroluminescent layer may comprise, for example, PPV (poly(p-phenylenevinylene)) and the hole transport layer, which helps match the hole energy levels of the anode layer and of the electroluminescent layer, may comprise, for example, PEDOT:PSS (polystyrene-sulphonate-doped polyethylene-dioxythiophene).

A multilayer cathode 110 overlies the OLED material 108 and, in a top-emitting device, is at least partially transparent at wavelengths at which the device is designed to emit. For a polymer LED the cathode preferably has a work function of less than 3.5 eV and may comprise a first layer having a low work function, for example a metal such as calcium, magnesium or barium, and a second layer adjacent the LEP layer 108b providing efficient electron injection, for example of barium fluoride or another metal fluoride or oxide. The top layer of the cathode 110 (that is the layer furthest from LEP layer 108b) may comprise a thin film of a highly conductive metal such as gold or silver. Metallic layers having a thickness of less than 50 nm, more preferably less than 20 nm have been found to be sufficiently optically transparent although it is preferable that the sheet resistance is kept low, preferably less than 100 ohms/square, more preferably less than 30 ohms/square. The cathode layer may be used to form cathode lines which can be taken out to contacts at the side of the device. In some configurations the anode, OLED material, and cathode layers may be separated by banks (or wells) such as banks 112 formed, for example, from positive or negative photoresist material. Banks 112 have an angle of approximately 15° to the plane of the substrate (although in FIG. 1 they are shown as having steep sides for ease of representation).

Broadly speaking there are five main criteria which suitable cathode electrode structures should aim to meet: transparency, a low series resistance to allow charge injection into the organic electroluminescent material, sufficient lateral conductivity to facilitate matrix addressing, encapsulation of the underlying organic layer(s) to protect it (them) from physical and chemical damage, and a deposition process which does not significantly damage the underlying organic layer(s). Since no single material has yet been found which meets all of these criteria the top emitter structures which have been published to date are multilayer structures (see, for example, U.S. Pat. No. 5,739,545, U.S. Pat. No. 5,714,838, WO99/31741, WO98/07202, U.S. Pat. No. 6,316,786, JP08185984, U.S. Pat. No. 5,457,565 and U.S. Pat. No. 5,429,884). For example U.S. Pat. No. 5,739,545 discloses a structure comprising an anode and cathode sandwiching an electroluminescent layer, the cathode layer comprising a thin metal layer, for example of calcium or MgAl, followed by a protective layer of wide band gap semi-conductor, for example zinc selenide (ZnSe), zinc sulphide (ZnS) or $ZnS_xSe_{1-x}$, and optionally a further layer of non-reactive metal or other conductive material such as aluminium, ITO or AlZnO. Such a structure is advantageous because both calcium and zinc selenide can be deposited by essentially damage free vapour deposition rather than by the sputtering which ITO requires.

Top-emitting and bottom-emitting OLED structures suffer from different problems. In bottom-emitting structures, in which the anode is transparent and the cathode comprises an opaque layer of metal, problems can arise resulting from the transmission of ambient light through the transparent anode into the device, where it reflects off the cathode and back out of the device in competition with the electroluminescent emission, thus reducing the contrast of the display. To address this problem it has been proposed that ambient light reflection from the cathode is reduced by incorporating an anti-reflection structure into the cathode, as described in Applied Physics Letters, vol 82, (16), 2715, U.S. Pat. No. 5,049,780, and WO01/08240. Other methods for improving the contrast of a bottom-emitting OLED device include the use of a circular polariser (see, for example, U.S. Pat. No. 6,211,613, to the present Applicant), and the use of a light absorbing material in the cathode (see, for example, WO00/35028 to the present Applicant).

In a top-emitting device, however, where it is desirable to meet the aforementioned criteria for a cathode electrode structure, one problem which arises is that of extracting the maximum amount of electroluminescently emitted light from the device rather than that of preventing ambient light falling on the device from escaping. Thus to improve the efficiency of top-emitting devices it is desirable to improve the efficiency with which photons generated within the organic electroluminescent layer 108 can be conducted through the cathode structure and out of the device towards an observer.

GENERAL DESCRIPTION

According to a first aspect of the present invention there is therefore provided an organic light emitting diode (OLED) comprising a substrate bearing a light emitting layer between an electrically conducting anode and an electrically conducting cathode, the diode being configured for light emission through said cathode, the cathode being transmissive at a light emission wavelength of the diode, and wherein said cathode incorporates an optical interference structure configured to enhance light transmission through said cathode at said emission wavelength.

The optical interference structure preferably comprises an optical interference or spacer layer sandwiched between first and third layers of different refractive indices and having a thickness such that reflections from (internal) front and back surfaces of the (interference) layer interfere to enhance light transmission through the cathode at the emission wavelength. This may be achieved by choosing the optical thickness of the interference layer to be an odd integral number of quarter wavelengths at the emission wavelength, which may comprise a peak or centre emission wavelength (for example, as the human eye perceives it) of the light emitting layer.

Generally electroluminescent OLED materials emit over a range of wavelengths rather than having a very sharply peaked output spectrum. The optical interference layer therefore preferably has an optical thickness of between a third of said emission wavelength and a fifth of said emission wavelength, more preferably substantially a quarter of said emission wavelength. However it will be appreciated that the precise thickness of the optical interference layer will not generally be exactly a quarter wavelength as this will depend upon the thicknesses of the adjoining first and third layers and, to some degree, upon the differences in refractive index. Thus preferably the thickness of the optical interference layer is determined by selecting a thickness which substantially maximises transmission through the cathode taking into account the effects of these other layers, and thus the optical thickness of the layer may, in embodiments, vary between $\lambda/3$ and $\lambda/5$, or sometimes even outside this range. However, broadly speaking, choosing a thickness of $\lambda/4$ rather than an increased thickness such as $3\lambda/4$ or $5\lambda/4$ helps to provide a broader band response, that is substantially maximising transmission over a broader range of emission wavelengths.

The light emitting layer may comprise any known organic electroluminescent material including, but not limited to, polymer-LED based materials, small-molecule based materials and dendrimer based materials. The first layer (which is closest or substantially adjacent to the light emitting layer) preferably comprises an electron-injecting layer or layers and any conventional material may be employed, depending upon the type of organic electroluminescent material used. Thus the electron-injecting layer may comprise, for example, a low work function metal such as calcium or barium or, more generally, any early transition metal, lanthanide or alkaline earth or metallic compound (for example carbide, nitride, boride, fluoride) thereof, or an alloy (including, for example, aluminium or magnesium) or a conducting polymer or a doped semiconductor and, as mentioned above, a multi-layer electron-injecting structure, for example comprising two layers of different work functions, may be employed. Generally, however, this electron-injecting layer is relatively thin, for example less than 30 nm. To improve the overall conductivity of the cathode layer the third layer preferably comprises an electrically conducting layer such as a layer of metal, for example gold, silver or aluminium. The thickness of the third layer is preferably chosen as a compromise between conductivity and transparency at the emission wavelength at which the device is designed to operate. Preferably this third layer has a thickness of less than 100 nm, more preferably less than 20 nm. Preferably one or both of the first and third layers comprise a material or materials which have a resistivity of less than 10,000 ohm cm, more preferably less than 1000 ohm cm.

The optical interference layer may comprise a layer of dielectric material such as silicon oxide (SiO and/or $SiO_2$), silicon nitride (SiN) or the like or a layer of semi-conducting material such as ITO, IZO (indium doped zinc oxide), zinc selenide, or gallium nitride (GaN). The latter two materials have the advantage that they may be deposited by evaporation rather than sputtering and thus are less likely to damage the underlying organic layers. An advantage of using a semiconducting material rather than a dielectric material is that the overall conductivity of the cathode is increased.

A top-emitting device as described above may employ an opaque anode but in some configurations the anode may be transmissive, for example where a light absorbing layer is provided between the electroluminescent layer and the driver transistors of an active matrix display. Using a transparent anode, optionally with a light absorbing layer of this type, may reduce reflection of ambient light from the structure.

The invention further provides a display device including an OLED as described above.

In a related aspect the invention provides an OLED-based display device including one or more OLEDs each comprising a layer of OLED material sandwiched between anode and cathode electrode layers, said OLED material electroluminescing when a current is passed between said anode and cathode electrode layers, a first of said electrode layers being at least partially transmissive at a peak wavelength of said electroluminescence and being closer to a display surface of said device than the second of said electrode layers whereby the device is configured for electroluminescent display through said first electrode layer, wherein said first electrode layer comprises a spacer layer sandwiched between a coupling layer for connecting to said OLED material and a third, substantially electrically conductive layer, and wherein said spacer layer has a thickness of approximately an odd integral number of quarter wavelengths at said peak electroluminescence wavelength such that transmission through said first electrode layer at said peak electroluminescence wavelength is substantially maximised.

As described above the spacer layer should have a refractive index different from both that of the coupling layer and from that of the third, substantially electrically conductive layer. In preferred configurations the first electrode layer is the cathode electrode layer, whereby the device is configured as a top-emitting device.

BRIEF DESCRIPTION OF THE DRAWINGS

These and other aspects of the invention will now be further described, by way of example only, with reference to the accompanying figures in which.

DETAILED DESCRIPTION

Figure 2:
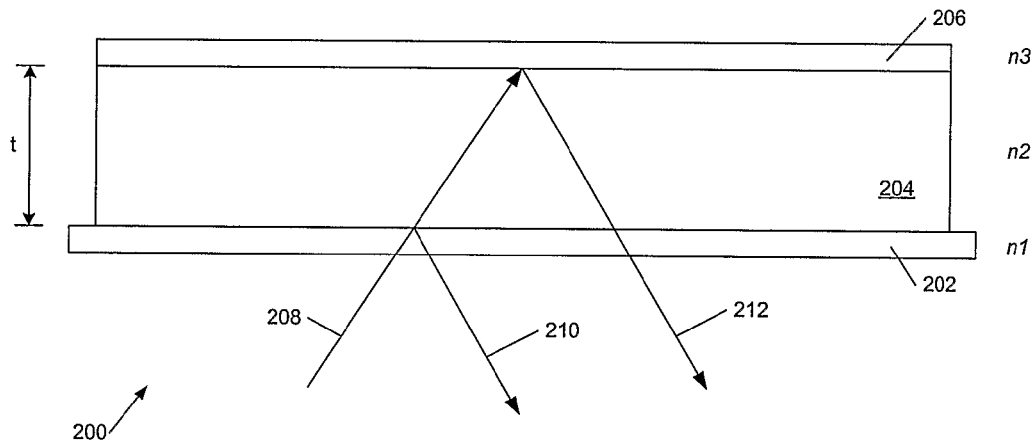
FIG. 2 shows a cathode layer structure according to an embodiment of the invention.

Referring to FIG. 2, this shows a model of a cathode structure 200 according to an embodiment of the present invention. The structure comprises a first layer 202, for example of calcium or barium and having a refractive index $n_1$, followed by a spacer layer 204, for example of ITO or zinc selenide and having a refractive index $n_2$, followed by a third layer 206, for example of gold, having a refractive index $n_3$. The first and third layers 202, 206 are preferably sufficiently thin to be substantially transparent to light of a relevant wavelength (generally the peak emission wavelength of the OLED in which the structure is incorporated) while the spacer layer 204 is of approximately quarter wavelength optical thickness. The optical thickness of the interference layer may be determined by multiplying the mechanical thickness of the layer by the refractive index of the layer at the relevant wavelength (in the green region of the spectrum $n_{ITO} \approx 1.85$).

Light 208, for example from an electroluminescent layer in an OLED propagating out through the cathode structure 200, is reflected at the two internal interfaces of the layer 204 with layers 202 and 206 respectively, resulting in reflected beams 210, 212. A full optical analysis of the structure shows that when the optical thickness $h (=n_2 t)$ of the layer 204, where t is the physical thickness of the layer, is equal to a quarter wavelength, beams 210 and 212 destructively interfere, minimizing reflected light and maximizing the transmitted light. In an optimization for a practical device reflections from other internal interfaces and from interfaces with the metal layers are taken into account and this can alter the optimum thickness of the layer 204 from the theoretical quarter wavelength thickness predicted by this simple model.

Figure 1:
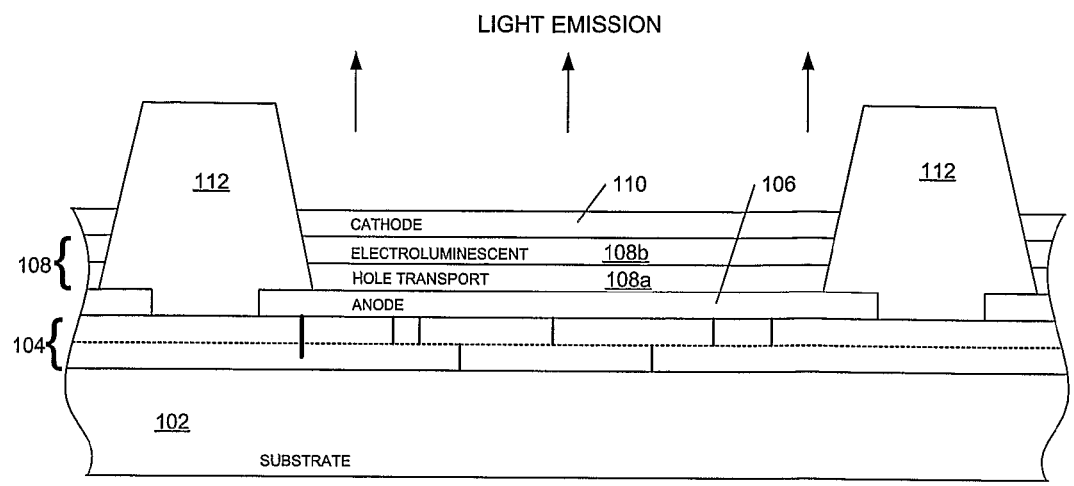
FIG. 1 shows a vertical cross section through a top-emitting OLED display device.
Figure 3:
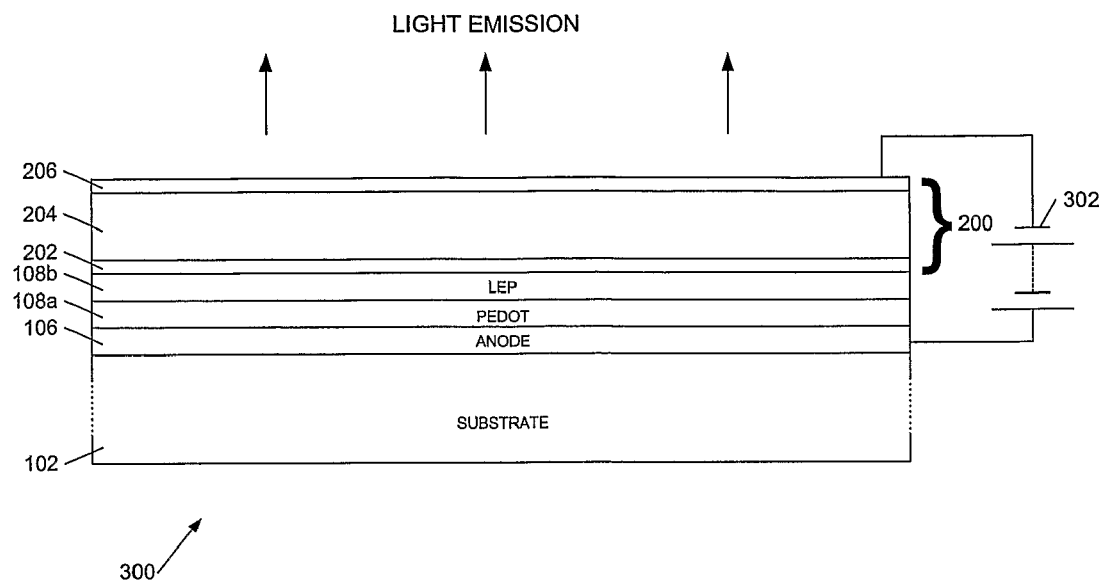
FIG. 3 shows an OLED incorporating the cathode structure of FIG. 2.

FIG. 3 shows an example of a top-emitting OLED structure 300 incorporating such a cathode structure. In the structure of FIG. 3 like elements to those of FIGS. 1 & 2 are indicated by like reference numerals and the OLED is forward biased by a battery 302.

Figure 4A:
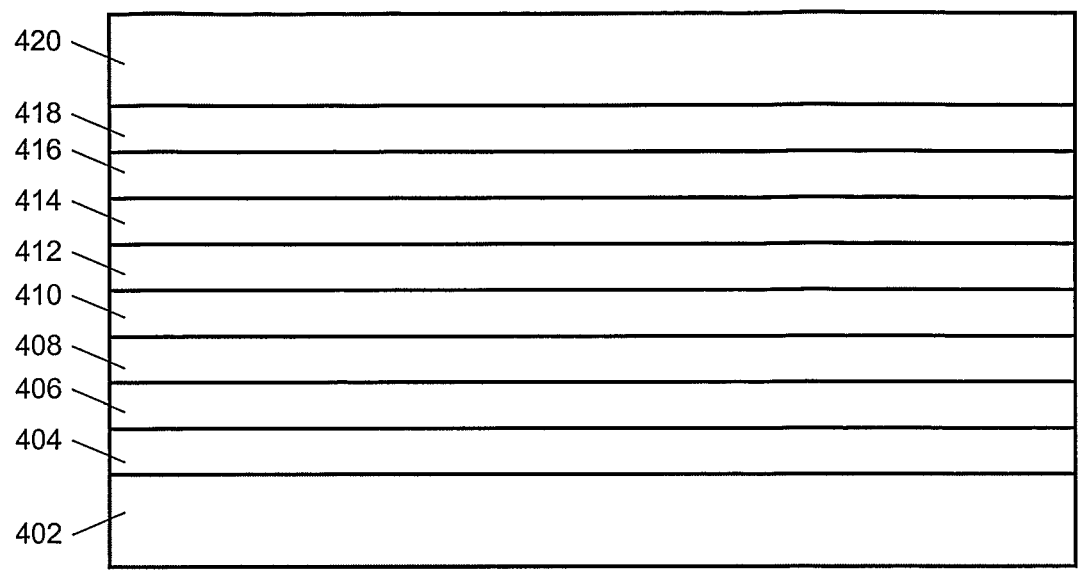
FIGS. 4a and 4b show top-emitting OLED devices respectively without and with a cathode incorporating an optical interference layer.

Referring now to FIG. 4a, this shows a schematic diagram of a substantially fully transparent OLED structure 400 without a cathode incorporating an optical interference layer. The layers in the structure 400 (which are not to scale) comprise a layer of glass 402, silicon monoxide 404, gold 406, calcium 408, barium fluoride 410, a yellow emitting electroluminescent polymer layer 412, a layer of PEDOT 414, an ITO anode layer 416, a layer of silicon dioxide 418, and a further glass layer 420. The gold 406, calcium 408 and barium fluoride 410 together comprise the cathode.

Figure 4B:
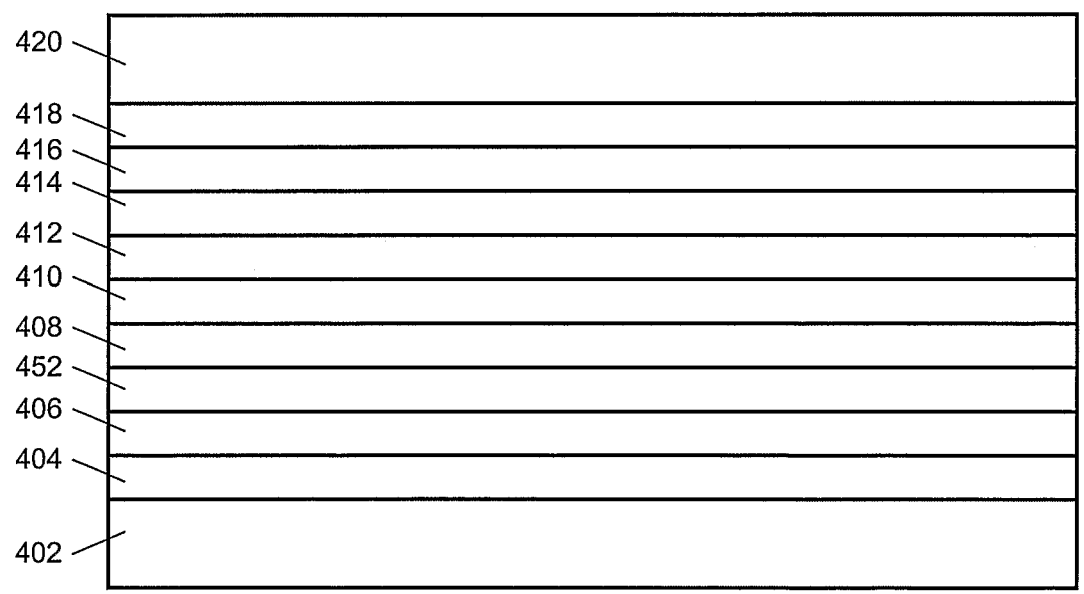

FIG. 4b shows a similar OLED structure 450, in which like elements are indicated by like reference numerals. The OLED 450, however, incorporates an additional layer of aluminum doped silicon monoxide (SiO:Al) 452 within the cathode. The thickness of this layer is selected, as described further below, to enhance transmission from electroluminescence from the layer 412 out through the cathode layers 410, 408, 452, 406 and thence through the silicon monoxide and glass layers 404, 402 by means of destructive interference to inhibit internal reflectance from the cathode layer. The silicon monoxide layer 404 is used as a capping layer for the cathode and does not play any significant part in enhancing transmission through (and reducing reflection from) the cathode.

Figure 5:
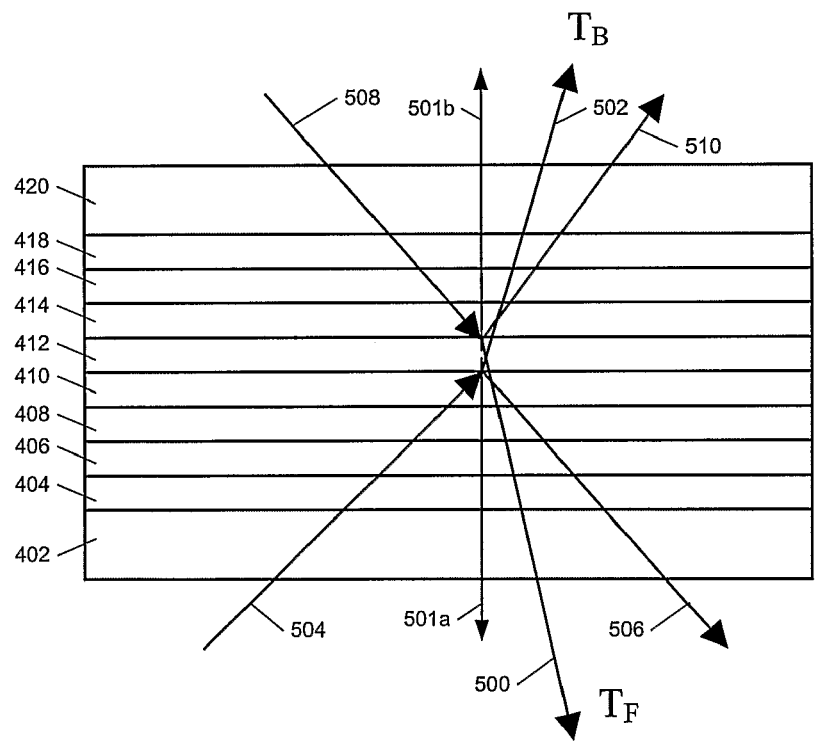
FIG. 5 shows a simplified schematic diagram of optical rays used to model the structures of FIGS. 4a and 4b.

FIG. 5 shows an optical schematic diagram of the device of FIG. 4a illustrating, in simplified form, some of the optical paths used to model the device; a similar set of paths may be used to model the device of FIG. 4b. Thus FIG. 5 shows a transmitted beam 501a from the electroluminescent layer 412 to the top or front of the device and a second transmitted beam 501b from the electroluminescent layer out of the back or bottom of the device. Rays 504, 506 show a reflection of ambient light from the front of the device and rays 508, 510 show a reflection of ambient light from the back of the device. Some ambient light is also transmitted through the device, along the rays 500 and 502. In practice it is preferable to take account of transmission paths from the electroluminescent layer 412 through all of the layers in the forward or top (and optionally backward) direction, considering the effects of all the internal interfaces, when modelling the optical system. Such a calculation may be performed by any one of a number of standard optical methods such as are disclosed in OPTICS by Eugene Hecht (Addison Wesley).

Table 1 below shows the thickness data used for modelling the transparent cathode structure in one exemplary calculation. In this example, the barium fluoride layer 410 has been omitted and layer 452 comprises ITO rather than SiO:Al. Refractive index data for the materials can be found in many standard reference sources, for example the CRC Handbook of Chemistry and Physics published by CRC Press LLC, USA or determined experimentally by standard techniques.

TABLE 1

| Material | Thickness (nm) |
| --- | --- |
| Glass | — |
| SiO$_2$ | 20 |
| ITO | 150 |
| PeDOT | 80 |
| CDTYllw | 80 |
| Ca | 5 |
| Au | 5 |
| Glass Substrate | — |

To model the cathode structure of FIG. 4b the additional data shown in table 2, below, was employed.

TABLE 2

| Material | Thickness (nm) |
| --- | --- |
| ITO | 75 |

Optical design software allows the thicknesses of the layers of the material comprising the cathode structure to be optimised to produce the highest value for transmission and the lowest value of the reflectivity when looking at a top emission structure. Suitable algorithms are described in Whittaker et al., *Physical Review B*, 1999, 60(4), 2610.

Figure 6:
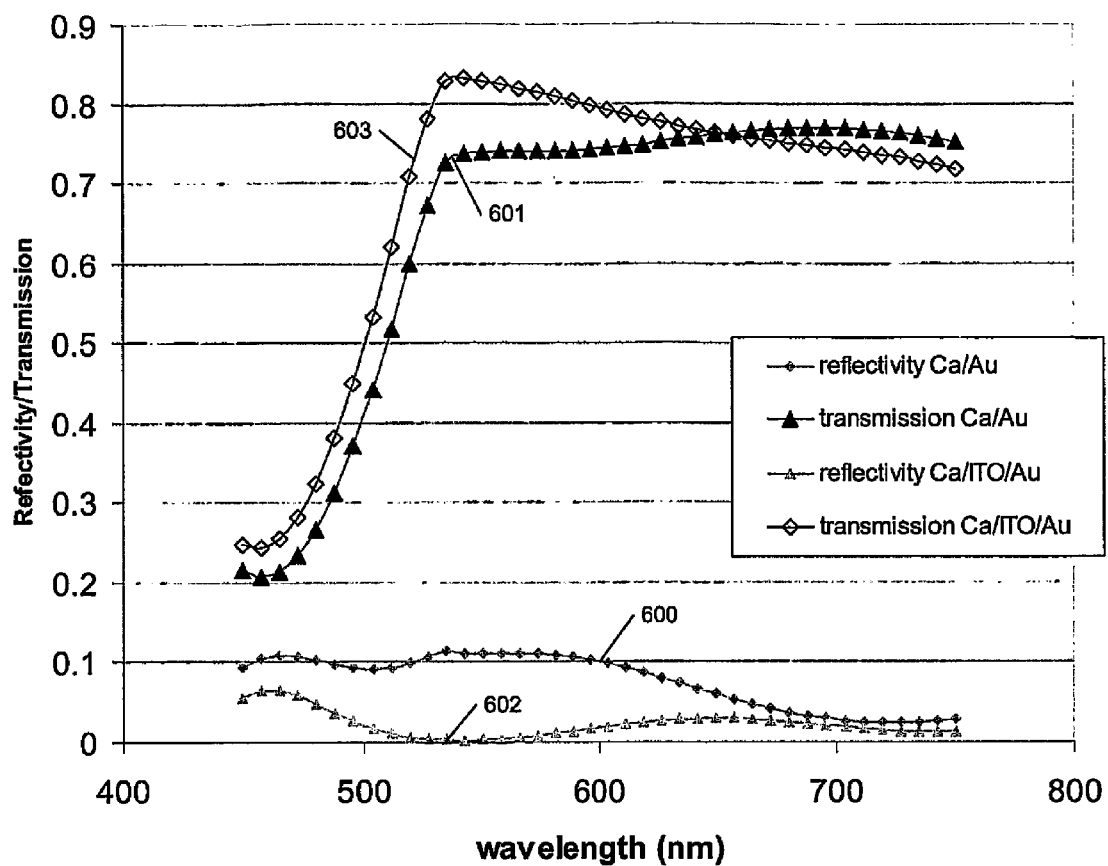
FIG. 6 shows transmission and reflectivity spectra for the structures of FIGS. 4a and 4b.

FIG. 6 shows a graph of transmission and reflectivity against wavelength through the structures 4a and 4b as predicted by the above mentioned optical design software. Curves 600 and 601 show the reflectivity and transmission through the structure 4a while curves 602 and 603 show the reflectivity and transmission through structure 4b. It can be seen that the structure of the FIG. 4b provides a significant reduction in the reflectivity whilst while causing an increase in the transmission through the structure when a cathode incorporating an optical interference layer is used, as compared to a similar cathode without such an interference layer.

No doubt many other effective alternatives will occur to the skilled person and it should be understood that the invention is not limited to the described embodiments but encompasses modifications apparent to those skilled in the art lying within the spirit and scope of the claims appended hereto.

The invention claimed is:

1. An organic light emitting diode (OLED) comprising a substrate bearing a light emitting layer between an electrically conducting anode and an electrically conducting cathode, the diode being configured for light emission through said cathode, the cathode being transmissive at a light emission wavelength of the diode, the cathode comprising an electron injecting layer for injecting electrons into said light emitting layer, an optical interference structure, and an electrically conducting layer, said electron injecting layer being closest to the light emitting layer and said optical interference structure being disposed between said electron injecting and electrically conducting layers, wherein said optical interference structure is configured to enhance light transmission through said cathode at said emission wavelength and comprises an optical interference layer disposed between first and third layers of different refractive indices such that reflections from front and back surfaces of said optical interference layer interfere to enhance light transmission through said cathode at said emission wavelength, said first layer comprising the electron injecting layer for injecting electrons into said light emitting layer, said third layer comprising the electrically conducting layer, and said optical interference layer having an optical thickness of between a third of said emission wavelength and a fifth of said emission wavelength.

2. An OLED as claimed in claim 1 wherein said optical interference layer has an optical thickness of substantially a quarter of said emission wavelength.

3. An OLED as claimed in claim 1 wherein said emission wavelength is substantially equal to a peak or center emission wavelength of said light emitting layer.

4. An OLED as claimed in claim 1 wherein said third layer comprises a metal layer.

5. An OLED as claimed in claim 1 wherein said optical interference layer comprises a wide bandgap semiconductor.

6. An OLED as claimed in claim 1 wherein said optical interference layer comprises a transparent conductor.

7. An OLED as claimed in claim 1 wherein said optical interference layer comprises a dielectric material.

8. An OLED as claimed in claim 1 wherein said electron injecting layer includes a layer of a metal.

9. A display device including an OLED as claimed in claim 1.

10. An organic light emitting diode (OLED)-based display device including one or more OLEDs each comprising a layer of OLED material sandwiched between anode and cathode electrode layers, said OLED material electroluminescing when a current is passed between said anode and cathode electrode layers, a first of said electrode layers being at least partially transmissive at a peak wavelength of said electroluminescence and being closer to a display surface of said device than the second of said electrode layers whereby the device is configured for electroluminescent display through said first electrode layer, wherein said first electrode layer comprises a spacer layer sandwiched between a coupling layer for connecting to said OLED material and a third, substantially electrically conductive layer, said coupling layer and said substantially electrically conductive layer having different refractive indices such that reflections from front and back surfaces of said spacer layer interfere to enhance light transmission through said cathode at said emission wavelength and wherein said spacer layer has a thickness of approximately an odd integral number of quarter wavelengths at said peak electroluminescence wavelength such that transmission through said first electrode layer at said peak electroluminescence wavelength is substantially maximized.

11. An OLED-based display device as claimed in claim 10 wherein said first electrode layer is said cathode electrode layer.

12. An OLED as claimed in claim 5 wherein said wide bandgap semiconductor comprises zinc selenide or gallium nitride.

13. An OLED as claimed in claim 6 wherein said transparent conductor comprises indium tin oxide or indium zinc oxide.

* * * * *

UNITED STATES PATENT AND TRADEMARK OFFICE
CERTIFICATE OF CORRECTION

| | | |
|---|---|---|
| PATENT NO. | : 7,843,125 B2 | |
| APPLICATION NO. | : 10/587195 | |
| DATED | : November 30, 2010 | |
| INVENTOR(S) | : Euan Smith et al. | |

It is certified that error appears in the above-identified patent and that said Letters Patent is hereby corrected as shown below:

At Column 7, line 14, "whilst while" should be -- while --.

Signed and Sealed this
Twenty-first Day of February, 2012

David J. Kappos
*Director of the United States Patent and Trademark Office*